(12) United States Patent
Chen et al.

(10) Patent No.: US 7,417,913 B2
(45) Date of Patent: Aug. 26, 2008

(54) FUSE CELL HAVING ADJUSTABLE SENSING MARGIN

(75) Inventors: Zhanping Chen, Portland, OR (US); Kevin Zhang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 178 days.

(21) Appl. No.: 11/377,135

(22) Filed: Mar. 15, 2006

(65) Prior Publication Data
US 2007/0217251 A1 Sep. 20, 2007

(51) Int. Cl.
*G11C 17/18* (2006.01)
(52) U.S. Cl. ............ 365/225.7; 365/148; 365/226
(58) Field of Classification Search .......... 365/225.7, 365/148, 226
See application file for complete search history.

(56) References Cited
U.S. PATENT DOCUMENTS

| 6,359,821 | B1 | 3/2002 | Roohparvar |
| 6,434,070 | B1 * | 8/2002 | Itou et al. ............ 365/203 |
| 6,496,434 | B1 | 12/2002 | Nobunaga |
| 6,507,525 | B1 | 1/2003 | Nobunaga et al. |
| 6,911,360 | B2 | 6/2005 | Li et al. |
| 7,224,633 | B1 * | 5/2007 | Hovis et al. ............ 365/225.7 |

* cited by examiner

*Primary Examiner*—Richard T. Elms
*Assistant Examiner*—Nam Nguyen
(74) *Attorney, Agent, or Firm*—Schwabe, Williamson & Wyatt, P.C.

(57) ABSTRACT

An apparatus, a method, and a system for fuse cells are disclosed herein. In various embodiments, a fuse cell may include circuitry to adjust a sensing margin. A fuse cell may include first and second fuse cells, and first and second resistance devices. The first resistance device may be configured to adjust a first voltage output from the first fuse cell, and the second resistance device may be configured to adjust a second voltage output from the second fuse cell. The first and second resistance devices may be configured adjust the first and second voltages asymmetrically.

23 Claims, 4 Drawing Sheets

FUSE CELL HAVING ADJUSTABLE SENSING MARGIN

TECHNICAL FIELD

Embodiments of the invention relate generally to the field of integrated circuit design, specifically to methods, apparatuses, and systems associated with or having fuse cells.

BACKGROUND

Increasingly, fuse technology is becoming integral for high performance microprocessor design. Fuses traditionally have been formed using polysilicon material having a relatively high pre-programmed resistance. In single-ended fuse cells using polysilicon, a ratio-based design has been employed whereby a reference branch has an increased number of fuses in order to generate a large voltage difference, which is then converted to a digital signal by a sense amplifier.

However, in processes using fuses having small pre-programmed resistances, sensing margin issues may be encountered. For example, metal fuses, having a much lower resistance than the traditional polysilicon fuses, may be incapable of producing a high enough sensing margin sufficient for a sense amplifier to flip. Although the traditional approach of increasing the number of fuses in the fuse cell may increase the sensing margin, this particular solution may have the drawback of reducing area-efficiency.

BRIEF DESCRIPTION OF THE DRAWINGS

Embodiments of the present invention will be readily understood by the following detailed description in conjunction with the accompanying drawings. Embodiments of the invention are illustrated by way of example and not by way of limitation in the figures of the accompanying drawings.

DETAILED DESCRIPTION OF EMBODIMENTS OF THE INVENTION

Illustrative embodiments of the present invention include but are not limited to methods associated with or having fuse cells having adjustable sensing margins, components contributing to the practice of these methods, in part or in whole, and systems endowed with such components.

In the following detailed description, reference is made to the accompanying drawings which form a part hereof and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use perspective-based descriptions such as up/down, back/front, and top/bottom. Such descriptions are merely used to facilitate the discussion and are not intended to restrict the application of embodiments of the present invention.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

The phrase "A/B" means "A or B". The phrase "A and/or B" means "(A), (B), or (A and B)". The phrase "at least one of A, B and C" means "(A), (B), (C), (A and B), (A and C), (B and C) or (A, B and C)". The phrase "(A) B" means "(B) or (A B)", that is, A is optional.

Figure 1:
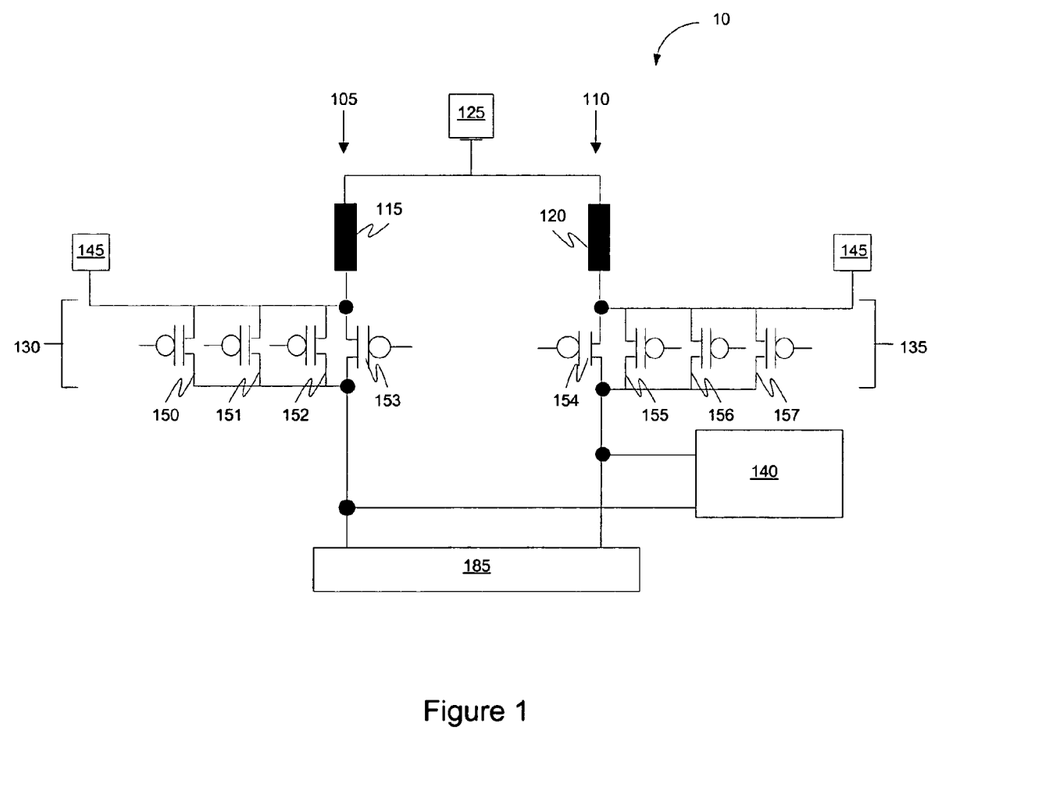
FIG. 1 illustrates a fuse cell for adjusting a sensing margin incorporated with the teachings of the present invention, in accordance with various embodiments.

Referring now to FIG. 1, illustrated is an embodiment of a fuse cell 10 having an adjustable sensing margin in accordance with various embodiments of the present invention. In various ones of these embodiments, a first branch 105 and a second branch 110 may be configured to be able to adjust voltages from a first fuse device 115 and a second fuse device 120 prior to outputting the voltages to a sense amplifier 140. For example, the voltages may be asymmetrically adjusted in order to produce a sensing margin large enough to flip a sense amplifier 140.

Fuse cell 10 in accordance with various embodiments of the present invention may be variously configured. In some embodiments, fuse devices 115, 120 may be metal fuses, poly fuses, or any other types of fuses known in the art. In various embodiments, fuse devices 115, 120 may have identical or different resistance values with respect to the other fuse devices of fuse cell 10. Further, in various embodiments, fuse devices 115, 120 may have identical or different geometries and/or process fabrication steps with respect to the other fuse devices of fuse cell 10. In various embodiments, fuse cell 10 may be single-ended or double-ended depending on the application of fuse cell 10. Still further, fuse cell 10 may comprise pre-programmed or unprogrammed fuse devices 115, 120. To be sure, fuse cells 10 and fuse devices 115, 120 may be variously configured yet remain in accordance with various embodiments of the present invention.

Still referring to fuse cell 10, in various embodiments, fuse cell 10 may comprise one or more fuse devices. For instance, first branch 105 of fuse cell 10 may comprise one or more fuse devices, arranged in series or in parallel, depending on the application. Likewise, in various embodiments, second branch 110 of fuse cell 10 may comprise one or more fuse devices, arranged in series or in parallel, depending on the application. As shown in FIG. 1 and in accordance with various embodiments of the present invention, fuse cell 10 may comprise two fuse devices: a first fuse device 115 and a second fuse device 120. In some of these embodiments, first fuse device 115 may be configured to receive a supply voltage from a supply voltage source 125 and output a first voltage. Likewise, in various embodiments, second fuse device 120 may be configured to receive a supply voltage from a supply voltage source 125 and output a second voltage.

Fuse devices 115, 120 may be coupled to resistance devices 130, 135 in accordance with various embodiments of the present invention. For example, in some embodiments, first fuse device 115 may be coupled to a first resistance device 130 to adjust the first voltage. Likewise, in some embodiments, second fuse device 120 may be coupled to a second resistance device 135 to adjust the second voltage. In various ones of these embodiments, first 130 and second resistance devices 135 may be configured to be able to adjust the first and second voltages asymmetrically. In various embodiments, fuse cell 10 may further comprise a sense amplifier 140 coupled to first 130 and second resistance devices 135. In various ones of these embodiments, sense amplifier 140 may be further configured to sense a difference between the adjusted first voltage and adjusted second voltage. As mentioned earlier, asymmetrical adjustment of first and second voltages may be done, for example, to produce a sensing margin large enough to flip sense amplifier 140. Still further, in various embodiments, sense amplifier 140 may be configured to generate a signal based on the sensed difference.

Resistance devices 130, 135 may be variously configured in accordance with various embodiments of the present invention. For example, in various embodiments, one or more of first 130 and second resistance devices 135 may include a plurality of switchable conductive path devices 150-157. Switchable conductive path devices 150-157 may comprise different types of transistor devices including, for example, PMOS and/or NMOS transistor devices. Furthermore, switchable conductive path devices 150-157 may be variously arranged, i.e., in series or parallel as shown in FIG. 1. Regarding switchable conductive path devices 153, 154, in various embodiments switchable conductive path devices 153, 154 may be PMOS or NMOS transistor devices and each shown switchable conductive path device 153, 154 may represent multiple devices arranged in series or in parallel. In various embodiments, each shown switchable conductive path devices 153, 154 may represent a different number of transistor devices from the other.

Switchable conductive path devices 150-157 of resistance devices 130, 135 may be further variously configured as to provide the desired resistance and resulting sensing margin. In various embodiments, for example, first resistance device 130 and second resistance device 135 may include a plurality of switchable conductive path devices 150-157, with first resistance device 130 including a different number of switchable conductive path devices than second resistance device 135. For example, as shown in FIG. 1, switchable conductive path devices 150-157 are provided. Although four switchable conductive path devices 150, 151, 152, 153 are shown in the first resistance device 130 and four switchable conductive path devices 154, 155, 156, 157 are shown in the second resistance device 135, each shown switchable conductive path device 150-157 may actually represent, in various embodiments, varying numbers of switchable conductive path devices in order to provide, for example, asymmetrical resistance of first and second voltages of first 105 and second branches 110. Before further describing illustrative embodiments of the invention, it should be noted that fuse cell of FIG. 1 is in no way the exclusive configuration of first 130 and second resistance devices 135, other configurations varied from the illustrative embodiments are anticipated.

Adjustment of the sensing margin may be further variously controlled. For example, one or more of switchable conductive path devices 150-157 may each be coupled to one or more control signal sources (not shown). In various ones of these embodiments, one or more of switchable conductive path devices 150-157 may be coupled to control signal source to receive one or more control signals from one or more control signal sources. Still further, in various embodiments, one or more switchable conductive path devices 150-157 may be configured to switch on when the one or more switchable conductive path devices 150-157 receive the control signal. For example, in various embodiments, if a resistance device 130 or 135 includes three switchable conductive path devices, control signal may switch on one or more of the three switchable conductive path devices, or control signal may switch on all switchable conductive path devices included in resistance device 130 or 135, which would be three is this example.

Fuse cell 10 may comprise other circuitry or devices 145, 185 in various embodiments in accordance with the present invention. In various embodiments, fuse cell 10 may comprise a programming device 145 coupled to first resistance device 130 and/or second resistance device 135. In various ones of these embodiments, programming device 145 may be configured to program the fuse device 115, 120 coupled to the selected resistance device 130, 135. In various embodiments, fuse cell 10 may comprise other circuitry 185 including, for example, additional sense amplifier circuitry, high voltage protection circuitry, various control signal sources, etc. In alternate embodiments, other various circuitry devices and/or design topologies may be enlisted, depending on the desired use and function of fuse cell 10. As shown, for example, fuse cell 10 may comprise two or more fuse devices 115, 120, one of fuse devices 115, 120 being coupled to programming circuitry 145.

Figure 2:
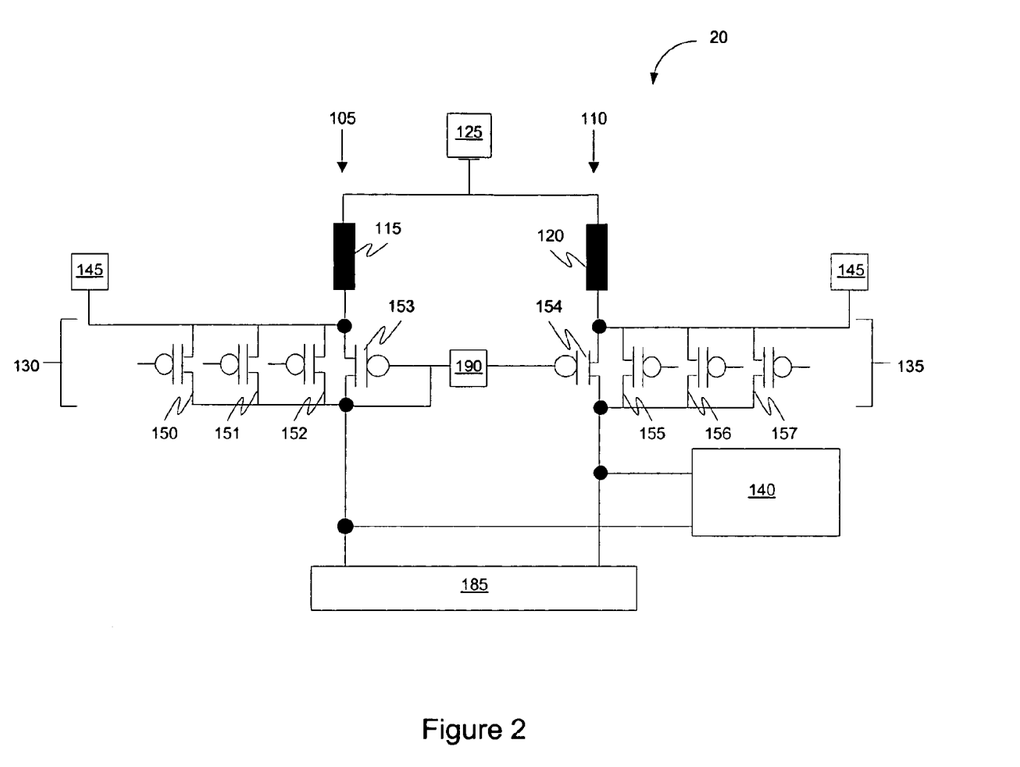
FIG. 2 illustrates another fuse cell for adjusting a sensing margin incorporated with the teachings of the present invention, in accordance with various embodiments.
Figure 3:
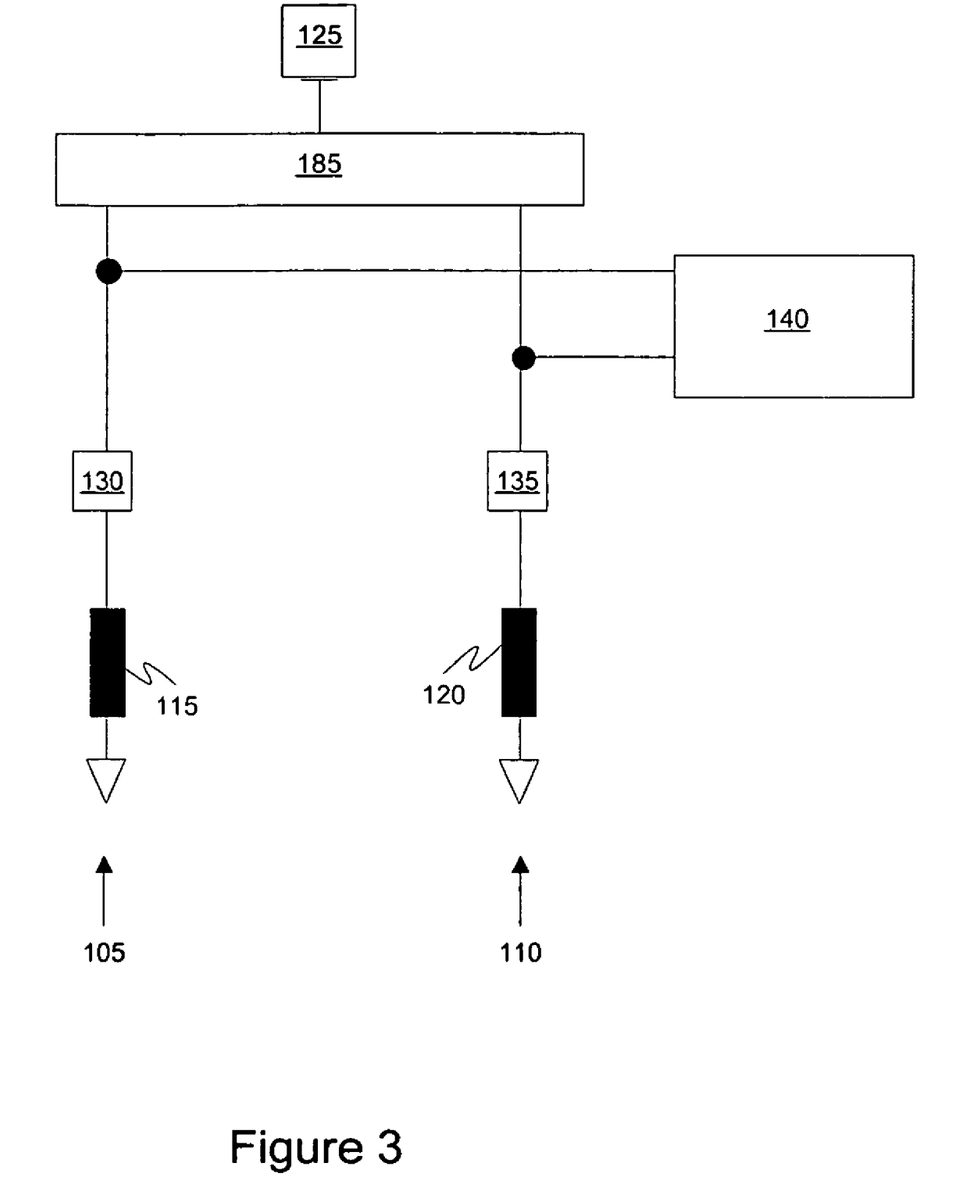
FIG. 3 illustrates another fuse cell for adjusting a sensing margin incorporated with the teachings of the present invention, in accordance with various embodiments.

FIG. 2 and FIG. 3 illustrate other embodiments of fuse cells in accordance with various embodiments of the present invention. In various embodiments and as shown in FIG. 2, fuse cell 20 may comprise a current mirror-based sense amplifier configuration by directly coupling first resistance device 130 and second resistance device 135. In various other embodiments, fuse cell 20 may comprise a current mirror-based sense amplifier configuration by indirectly coupling first resistance device 130 and second resistance device 135 through various circuitry, including, for example, a protection circuit 190. In yet another embodiment and as shown in FIG. 3, fuse cell 30 may comprise other circuitry 185 which may be configured to receive a supply voltage from a supply voltage source 125.

Figure 4:
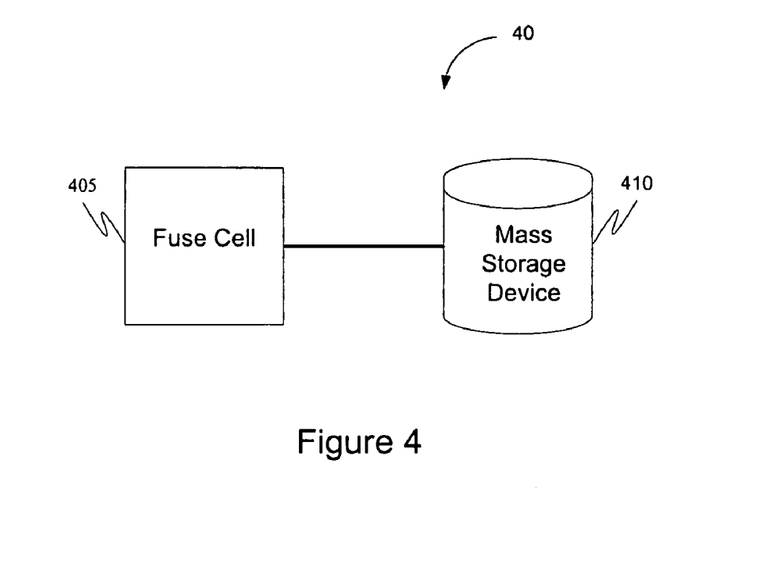
FIG. 4 illustrates a system for adjustment of a sensing margin incorporated with the teachings of the present invention, in accordance with various embodiments.

Turning now to FIG. 4, illustrated is a system 40 having a fuse cell with an adjustable sensing margin in accordance with various embodiments of the present invention. As shown and in various embodiments, system 40 may comprise one or more fuse cells 405 and one or more mass storage devices 410 coupled to fuse cell 405. In these embodiments, fuse cell 405 may comprise a first branch and a second branch being configured to be able to adjust voltages from a first fuse device and a second fuse device prior to outputting the voltages to a sense amplifier. For example, as discussed previously, the voltages may be asymmetrically adjusted in order to produce a sensing margin large enough to flip a sense amplifier.

Fuse cell 405 in accordance with various embodiments of the present invention may be variously configured. In some embodiments, fuse devices (not shown) of fuse cell 405 may be metal fuses, poly fuses, or any other types of fuses known in the art. In various embodiments, fuse cell 405 may be single-ended or double-ended depending on the application of the fuse cell 405. Still further, fuse cell 405 may comprise pre-programmed or unprogrammed fuse devices. Fuse cells 405 and fuse devices may be variously configured yet remain in accordance with various embodiments of the present invention.

Still referring to fuse cell 405, in various embodiments, fuse cell 405 may comprise various numbers of fuse devices.

In accordance with various embodiments of the present invention, fuse cell 405 may comprise two fuse devices: a first fuse device and a second fuse device (not shown). In some of these embodiments, first fuse device may be configured to receive a supply voltage from a supply voltage source and output a first voltage. Likewise, in various embodiments, second fuse device may be configured to receive a supply voltage from a supply voltage source and output a second voltage.

Fuse devices may be coupled to resistance devices (not shown) in accordance with various embodiments of the present invention. For example, in some embodiments, first fuse device may be coupled to a first resistance device to adjust the first voltage. Likewise, in some embodiments, second fuse device may be coupled to a second resistance device to adjust the second voltage. In various ones of these embodiments, first and second resistance devices may be configured to be able to adjust the first and second voltages asymmetrically. In various embodiments, fuse cell 405 may further comprise a sense amplifier (not shown) coupled to first and second resistance devices. In various ones of these embodiments, sense amplifier may be further configured to sense a difference between the adjusted first voltage and adjusted second voltage. As mentioned earlier, asymmetrical adjustment of first and second voltages may be done, for example, to produce a sensing margin large enough to flip a sense amplifier. Still further, in various embodiments, sense amplifier may be configured to generate a signal based on the sensed difference.

Resistance devices may be variously configured in accordance with various embodiments of the present invention. For example, in various embodiments, one or more of first and second resistance devices may include a plurality of switchable conductive path devices. Switchable conductive path devices may comprise different types of transistor devices including, for example, PMOS transistor devices. Furthermore, switchable conductive path devices may be variously arranged, i.e., in series or parallel.

Switchable conductive path devices of resistance device may be further variously configured as to provide the desired resistance and resulting sensing margin. In various embodiments, for example, first resistance device and second resistance device may include a plurality of switchable conductive path devices, with first resistance device including a different number of switchable conductive path devices than second resistance device. The number of switchable conductive path devices between resistance devices may be varied, for example, to provide asymmetrical resistance of first and second voltages of first and second fuse devices.

Adjustment of the sensing margin may be further variously controlled. For example, one or more of switchable conductive path devices may be coupled to one or more control signal sources (not shown). In various ones of these embodiments, one or more of switchable conductive path devices may be coupled to control signal source to receive one or more control signals from one or more of the control signal source. Still further, in various embodiments, one or more switchable conductive path devices may be configured to switch on when the transistor devices receive the control signal. For example, in various embodiments, if a resistance device 130 or 135 includes three switchable conductive path devices, control signal may switch on one or more of the three switchable conductive path devices, or control signal may switch on all switchable conductive path devices included in a resistance device 130 or 135, which would be three is this example.

Fuse cell 405 may comprise other circuitry or devices in various embodiments in accordance with the present invention. In various embodiments, fuse cell 405 may comprise a programming device coupled to first resistance device and/or second resistance device. In various ones of these embodiments, programming device may be configured to program the fuse device coupled to the selected resistance device. In various embodiments, fuse cell 405 may comprise other circuitry including, for example, additional sense amplifier circuitry, high voltage protection circuitry, various control signal sources, etc. In alternate embodiments, various circuitry devices and/or design topologies that may be enlisted, depending on the desired use and function of fuse cell 405.

Figure 5:
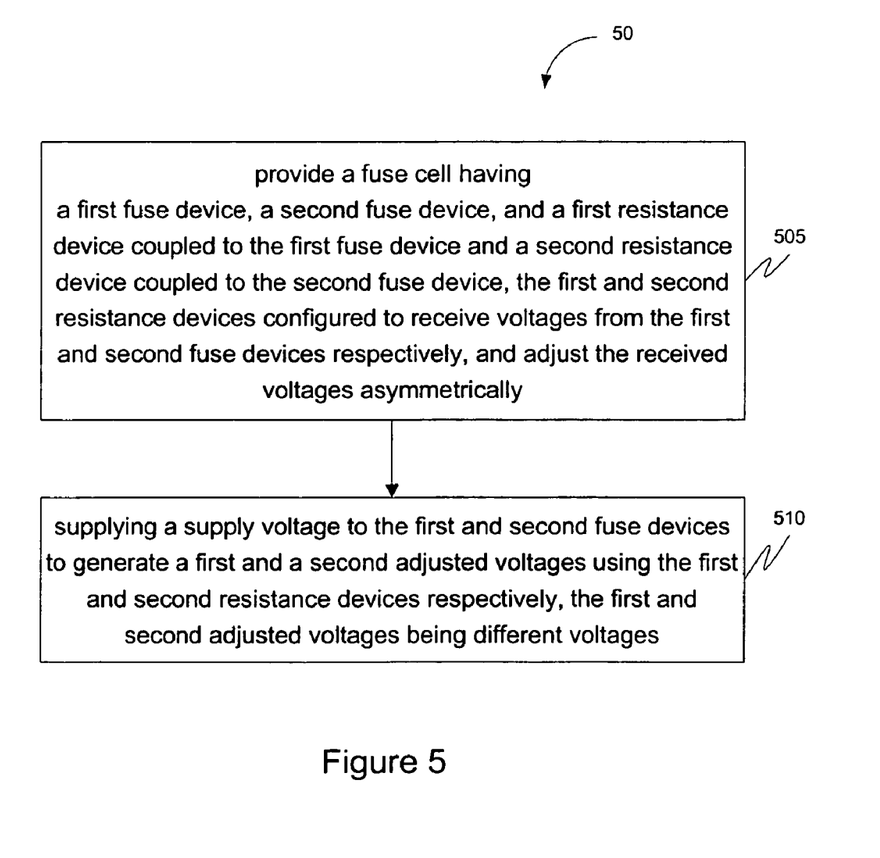
FIG. 5 illustrates a method for adjusting a sensing margin incorporated with the teachings of the present invention, in accordance with various embodiments.

FIG. 5 illustrates an embodiment of a method 50 of providing and/or using fuse cells with adjustable sensing margins in accordance with various embodiments of the present invention. In these embodiments and as shown, method 50 may comprise providing a fuse cell. In various ones of these embodiments, providing a fuse cell may comprise providing a fuse cell having a first fuse device, a second fuse device, and a first resistance device coupled to first fuse device and a second resistance device coupled to the second fuse device 505. Further, in various ones of these embodiments, first and second resistance devices may be configured to asymmetrically adjust the voltages output to a sense amplifier 505. As discussed previously, adjustment of the voltages output to a sense amplifier may done in various embodiments to produce a sensing margin large enough to flip a sense amplifier.

Further, in various embodiments, method 50 may comprise supplying a supply voltage to the first and second fuse devices. In various ones of these embodiments, supplying a supply voltage to first and second fuse devices may be done to generate a first and a second adjusted voltage using first and second resistance devices respectively, the first and second adjusted voltages being different voltages 510. With respect to the adjusted voltages, in various ones of these embodiments, method 50 may comprise sensing a difference between the first adjusted voltage and the second adjusted voltage. For example, in various embodiments, method 50 may comprise providing the adjusted first and second voltages to a sense amplifier. Still further, in some embodiments, sense amplifier may generate a signal based on the sensed difference between first adjusted voltage and second adjusted voltage.

Method 50 in accordance with various embodiments of the present invention may comprise variously controlling adjustment of the sensing margin. For example, method 50 may comprise supplying one or more control signals to one or more switchable conductive path devices of one or more resistance devices. In various embodiments, supplying a control signal to one or more switchable conductive path devices may comprise supplying a control signal to switch on the switchable conductive path devices. As discussed previously, control signal may switch on one or more switchable conductive path devices or may switch on all switchable conductive path devices of a resistance device.

Various embodiments of apparatuses, systems, and methods in accordance with the present invention may be derived from the illustrative embodiments, and are anticipated. For example, various integrated circuit architecture and various circuit topologies may be enlisted in accordance with this invention. For example, as discussed earlier, various embodiments of the present invention may include programming devices, sense amplifier circuitry, high voltage protection circuitry, various control signal sources, etc., as well as methods of using these devices to adjust a sensing margin. Further, fuse cell may comprise multiple fuse devices, not merely the two as shown in the drawings.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

The invention claimed is:

1. An apparatus, comprising:
   a first fuse device configured to receive a supply voltage from a supply voltage source, and output a first voltages;
   a first resistance device coupled to the first fuse device and configured to switch between on and off to selectively adjust ust the first voltage;
   a second fuse device parallel to the first fuse device relative to the supply voltage source and configured to receive the supply voltage from the supply voltage source, and output a second voltage; and
   a second resistance device coupled to the second fuse device and configured to switch between on and off to selectively adjust the second voltage, the first and second resistance devices configured to asymmetrically adjust the first and second voltages; and
   a sense amplifier serielly connected to the first and second resistance devices such that the first resisitance device is connected in series between the first fuse device and the sense amplifier, and the second resistance device is connected in series between the second fuse device and the sense amplifier, wherein the sense amplifier is configured to sense a difference between the adjusted first voltage and the adjusted second voltage.

2. The apparatus of claim 1, wherein the sense amplifier is further configured to generate a signal based on the sensed difference.

3. The apparatus of claim 1, further comprising a programming device coupled to a selected one of the first resistance device and the second resistance device, and configured to program the fuse device coupled to the selected resistance device.

4. The apparatus of claim 1, wherein at least one of the first resistance device and the second resistance device includes a plurality of switchable conductive path devices.

5. The apparatus of claim 4, wherein the switchable conductive path devices comprise PMOS transistor devices coupled in parallel.

6. The apparatus of claim 4, wherein each of the first resistance device and the second resistance device includes a plurality of switchable conductive path devices, with the first resistance device including a different number of switchable conductive path devices than the second resistance device.

7. The apparatus of claim 4, wherein each of the first resistance device and the second resistance device includes a plurality of switchable conductive path devices, with the first resistance device having a different resistance value than the second resistance device.

8. The apparatus of claim 4, wherein one or more of the switchable conductive path devices are coupled to and configured to receive a control signal from one or more control signal sources, and wherein the one or more of the switchable conductive path devices are configured to switch on when the switchable conductive path devices receive the control signal.

9. A method, comprising:
   providing a fuse cell, having:
      a first fuse device;
      a second fuse device parallel to the first fuse device;
      a first resistance device coupled to the first fuse device and a second resistance device coupled to the second fuse device, the first and second resistance devices configured to receive voltages from the first and second fuse devices respectively, and further configured to switch between on and off to asymmetrically adjust the received voltages; and
      a sense amplifier serielly connected to the first and second resistance device such that the first resistance device is connected in series between the first fuse device and the sense amplifier, and the second resistance device is connected in series between the second fuse device and the sense amplifier, wherein the sense amplifier is configured to sense a difference between the adjusted first voltage and the adjusted second voltage; and
   supplying a supply voltage to the first and second fuse devices to generate a first and a second adjusted voltage using the first and second resistance devices respectively, the first and second adjusted voltages being different voltages.

10. The method of claim 9, further comprising providing the adjusted first and second voltages to the sense amplifier.

11. The method of claim 10, further comprising sensing a difference between the first adjusted voltage and the second adjusted voltage.

12. The method of claim 11, further comprising generating a signal based on the sensed difference.

13. The method of claim 9, wherein said supplying of a supply voltage to the first fuse device comprises supplying a first voltage to a first plurality of transistor devices, and wherein said supplying of a supply voltage to the second fuse device comprises supplying a second voltage to a second plurality of transistor devices.

14. The method of claim 13, further comprising supplying a control signal to one or more of the switchable conductive path devices.

15. The method of claim 14, wherein said supplying of a control signal to one or more of the switchable conductive path devices comprises supplying the control signal to switch on the switchable conductive path devices.

16. A system, comprising:
   a fuse cell, having:
      a first fuse device configured to receive a supply voltage from a supply voltage source, and output a first voltage;
      a first resistance device coupled to the first fuse device end configured to switch between on and off to adjust the first voltage;
      a second fuse device parallel to the first fuse device relative to the supply voltage source and configured to receive the supply voltage from the supply voltage source, and output a second voltage;
      a second resistance device coupled to the second fuse device and configured to switch between on and off to adjust the second voltage, the first and second resistance devices configured to asymmetrically adjust the first and second voltages; and
      a sense amplifier seielly connected to the first and second resistance devices such that the first resistance device is connected in series between the first fuse device and the sense amplifier, and the second fuse device and the sense amplifier, wherein the sense amplifier is configured to sense a difference between the adjusted first voltage and the adjusted second voltage; and one or more mass storage devices coupled to the fuse cell.

17. The system of claim 16, wherein the sense amplifier is further configured to generate a signal based on the sensed difference.

18. The system of claim 16, further comprising a programming device coupled to a selected one of the first resistance device and the second resistance device, and configured to program the fuse device coupled to the selected resistance device.

19. The system of claim 16, wherein at least one of the first resistance device and the second resistance device includes a plurality of switchable conductive path devices.

20. The system of claim 19, wherein the switchable conductive path devices comprise PMOS transistor devices coupled in parallel.

21. The system of claim 19, wherein each of the first resistance device and the second resistance device includes a plurality of switchable conductive path devices, with the first resistance device including a different number of switchable conductive path devices than the second resistance device.

22. The system of claim 19, wherein each of the first resistance device and the second resistance device includes a plurality of switchable conductive path devices, with the first resistance device having a different resistance value than the second resistance device.

23. The system of claim 22, wherein one or more of the switchable conductive path devices are coupled to and configured to receive a control signal from one or more control signal sources, and wherein the one or more of the switchable conductive path devices are configured to switch on when the switchable conductive path devices receive the control signal.

* * * * *

UNITED STATES PATENT AND TRADEMARK OFFICE
CERTIFICATE OF CORRECTION

PATENT NO. : 7,417,913 B2
APPLICATION NO. : 11/377135
DATED : August 26, 2008
INVENTOR(S) : Chen et al.

It is certified that error appears in the above-identified patent and that said Letters Patent is hereby corrected as shown below:

Column 7
Line 19, "...a first voltages;..." should read --...a first voltage;...--.
Line 22, "...adjust ust the first voltage;..." should read --...adjust the first voltage;...--.
Line 32, "...serielly connected..." should read --...serially connected...--.
Line 33, "...first resisitance..." should read --...first resistance...--.

Column 8
Line 14, "...serielly connect..." should read --...serially connect...--.
Lines 14-15, "...first and second resistance device..." should read --first and second resistance devices...--.
Line 54, "...end configured..." should read --...and configured...--.
Line 65, "...seielly connected..." should read --...serially connected...--.

Column 9
Lines 1-2, "...the sense amplifier, and the second fuse device and the sense amplifier, wherein..." should read --...the sense amplifier, and the second resistance device is connected in series between the second fuse device and the sense amplifier, wherein...--.

Signed and Sealed this

Sixteenth Day of March, 2010

David J. Kappos
*Director of the United States Patent and Trademark Office*